United States Patent [19]

Jordan et al.

[11] 4,412,091

[45] Oct. 25, 1983

[54] POLYCRYSTALLINE PHOTOVOLTAIC CELL

[75] Inventors: John F. Jordan; Curtis M. Lampkin, both of El Paso, Tex.

[73] Assignee: Photon Power, Inc., El Paso, Tex.

[21] Appl. No.: 127,149

[22] Filed: Mar. 4, 1980

Related U.S. Application Data

[60] Division of Ser. No. 25,840, Apr. 2, 1979, Pat. No. 4,304,607, which is a division of Ser. No. 892,375, Mar. 31, 1978, Pat. No. 4,159,914, which is a continuation-in-part of Ser. No. 631,815, Nov. 14, 1975, Pat. No. 4,086,101, which is a continuation-in-part of Ser. No. 508,570, Sep. 23, 1974, abandoned, which is a continuation-in-part of Ser. No. 431,705, Jan. 8, 1974, Pat. No. 3,880,633.

[51] Int. Cl.$^3$ ............................................. H01L 31/06
[52] U.S. Cl. ................................. 136/258; 136/260; 357/30; 357/59; 357/62
[58] Field of Search ....... 136/89 CD, 89 TF, 258 PC, 136/260; 427/74; 357/30, 59, 62

[56] References Cited

U.S. PATENT DOCUMENTS 4,143,235  3/1979  Duisman ..................... 136/89 CD Primary Examiner—Aaron Weisstuch
Attorney, Agent, or Firm—Richards, Harris & Medlock

[57] ABSTRACT

A photovoltaic cell having an electrically conductive substrate, which may be glass having a film of conductive tin oxide; a first layer containing a suitable semiconductor, which layer has a first component film with an amorphous structure and a second component film with a polycrystalline structure; a second layer forming a heterojunction with the first layer; and suitable electrodes where the heterojunction is formed from a solution containing copper, the amorphous film component is superposed above an electrically conductive substrate to resist permeation of the copper-containing material to shorting electrical contact with the substrate. The penetration resistant amorphous layer permits a variety of processes to be used in forming the heterojunction with even very thin layers (1–6$\mu$ thick) of underlying polycrystalline semiconductor materials. In some embodiments, the amorphous-like structure may be formed by the addition of aluminum or zirconium compounds to a solution of cadmium salts sprayed over a heated substrate.

6 Claims, No Drawings

POLYCRYSTALLINE PHOTOVOLTAIC CELL

BACKGROUND OF THE INVENTION

This application is a continuation-in-part of our prior application for U.S. patent, Ser. No. 25,840, filed Apr. 2, 1979, now U.S. Pat. No. 4,304,607, which is a division of our prior application for U.S. patent, Ser. No. 892,375 filed Mar. 31, 1978, and issued July 3, 1979 as U.S. Pat. No. 4,159,914, which in turn is a continuation-in-part of our prior application for U.S. patent, Ser. No. 631,815, filed Nov. 14, 1975 and issued Apr. 25, 1978 as U.S. Pat. No. 4,086,101, which in turn is a continuation-in-part of our prior application for U.S. patent, Ser. No. 508,570 filed Sept. 23, 1974, and now abandoned, which is a continuation-in-part of our prior application for U.S. patent, Ser. No. 431,705, filed Jan. 8, 1974, which issued Apr. 29, 1975 as U.S. Pat. No. 3,880,633, all of the above being assigned to a common assignee.

It is known to form photovoltaic cells by coating on a hot sheet of Nesa glass, or glass previously coated with $SnO_x$, a thin film of CdS, by spraying a water solution of compounds which form a layer of CdS microcrystals on the $SnO_x$, and providing a $Cu_xS$ heterojunction as a layer on the CdS layer, and forming electrodes on the film of $Cu_xS$. In accordance with our prior applications, referred to hereinabove, the $Cu_xS$ layer may be formed by spraying a $Cu_xS$-forming solution on the CdS film while the substrate was hot, or the $Cu_xS$ may instead be formed by dipping or by electroplating, or by a combination of both, at or near room temperature.

Photovoltaic cells have heretofore utilized relatively thick films of CdS, or have resorted to other expedients to obviate the difficulty that CdS films generally permit permeation by $Cu_xS$ and Cu, when $Cu_xS$ is formed by dipping or electroplating, i.e., by ion exchange. This permeation provides short circuits between the $Cu_xS$ layer and the $SnO_x$, the latter constituting the negative electrode of the cell, rendering the cell inoperative. In order to convert solar energy to electrical energy on a large scale, square miles of solar cells may be required. Since Cd is a rare and expensive metal, it becomes important to form photovoltaic cells with minimum quantities of CdS and hence with extremely thin CdS films. Moreover, the cells must be reliably fabricated and have long life.

We have produced photovoltaic cells having layers of CdS and with a total thickness of about 2 to 6 microns thick, yet which show zero shorting permeation, at least one of the layers being highly resistant to permeation by $Cu_xS$ or Cu-containing solution. We have heretofore used the method of spraying a solution which forms CdS on a glass coated with $SnO_x$, the spray being intermittent and covering only a small portion of the glass at a given point in time, while the surface of the glass is maintained at a uniform and constant temperature in the range between 230° C. and 600° C.

According to the present invention, in one embodiment, multiple spray applications are required to form the CdS layer. Each spray comprises a solution containing a cadmium compound and a sulfur containing compound. However, to one spray is added a metallic compound, such as $AlCl_3.6H_2O$, in proportions such that the first layer has a metal content of at least 10 molar percent of the total metal ion content of the solution and the resulting film. In a superposed spray solution, a second layer of generally pure CdS is formed.

Instead of applying two discrete films, one formed from a spray containing a large quantity of metallic compound and the other containing little or none, a single film may be formed by gradually decreasing the metallic compound content of the solution being sprayed in proceeding from the statum of the film adjacent to the $SnO_x$ layer to the stratum of the film adjacent to the exposed surface of the CdS film. In this manner the stratum of the CdS film adjacent to the $SnO_x$ layer contains significantly greater quantities of the metal in a second compound form than the stratum of the film adjacent to the exposed surface of the CdS film.

After heat treatment at a temperature in the range of 400° C. to 550° C., it is found that the portion of the CdS layer containing the second metallic compound is extremely hard and highly adherent to the $SnO_x$ layer, so that it can only with difficulty be removed by application of acid or by scraping and is highly resistant to permeation by chemicals involved in forming a $Cu_xS$ layer by ion exchange, or to $Cu_xS$ and inhibits diffusion of Cu through a CdS layer. The metallic compound in the CdS film is in the relatively large quantities resulting from use of solutions containing the selected metal in a quantity representing at least 10 molar percent of the total metal ion content of the solution and does not constitute a doping procedure, such as disclosed in Middleton, et al., U.S. Pat. No. 3,411,050. Rather it comprises a compound or material having properties quite distinct from those of CdS or CdS containing only small amounts of metallic materials. It has been found that even if the entire film of CdS includes these large quantities of metallic compounds the cell remains operative, but at reduced efficiency.

SUMMARY OF THE INVENTION

A photovoltaic cell is provided with a material layer which is highly resistant to permeation by copper containing compounds. The permeation resistant layer precludes the formation of internal short circuit paths by copper and copper compounds and enables the production of large area photovoltaic panels for the production of useful quantities of electrical energy from incident solar radiation.

A preferred embodiment is the $CdS/Cu_xS$ photovoltaic cell. The cell includes a transparent substrate having an electrically conductive and transparent coating, which may be $SnO_x$; one or more layers of CdS superposed over said conductive coating, at least one of the CdS layers including a metallic compound which produces an amorphous-like structure; a layer of $Cu_xS$ forming a photovoltaic heterojunction with the CdS; and electrodes for electrically interconnecting the cells. In various embodiments the metallic compound includes aluminum (Al) or zirconium (Zr). The CdS layer containing the metallic compound is formed from a solution containing a cadmium salt and a compound containing the selected metal, the selected metal forming at least 10 molar percent of the solution.

An advantage of the present invention is the formation of large area photovoltaic panels without internal short circuit paths.

Another advantage of the present invention is to permit forming a heterojunction by processes including spraying, dipping, or electroplating.

Yet another advantage of the present invention is the use of very thin films of CdS, conserving available cadmium resources.

DETAILED DISCLOSURE

The disclosures of the co-pending parent applications are hereby imported by reference into this application, the process as there disclosed being applied to a glass substrate as the glass substrate travels through a plurality of heated zones which may be tanks containing a molten salt or a molten metal. Alternately, heat may be supplied by other convenient means, such as radiative heating. In the course of spraying the substrate with solution, the upper surface of the substrate is cooled by the spray. It is then desirable to conduct the spraying operation so that the substrate surface can acquire from the heated zone enough heat to recover the temperature of the exposed surface of the substrate between sprays applied by any area. This process provides a uniform layer thickness, and also facilitiates maintenance of constant temperature, or maintains the temperature more nearly constant than is otherwise feasible. Suitable processes for performing these steps are set out in U.S. patent application Ser. No. 886,890, now U.S. Pat. No. 4,224,355, which disclosure is incorporated herein by reference.

Subject to the considerations stated in the immediately preceding paragraph, glass is heated to maintain the exposed surface of the glass at a temperature in the range of 230° C. to 600° C., and it is assumed for the purpose of the present invention that the glass has been coated with $SnO_x$ in a thin transparent layer, or by the methods taught in our parent application.

In a conventional photovoltaic cell, a layer of CdS or other suitable semiconductor material is formed which is polycrystalline in nature. A layer of $Cu_xS$ is then formed over the CdS by spray depositing a solution which reacts chemically to form $Cu_xS$ or by an ion exchange process involving dipping the CdS layer in a solution of copper ions whereby $Cu_xS$ is formed by a Cd-Cu ion-exchange mechanism. In some cases, an electric field has been applied in an attempt to drive this process. Finally, electrodes are applied to facilitate external interconnections.

It has been found that the copper-containing compounds tend to permeate the CdS polycrystalline structure, particularly concentrating along crystallite grain boundaries. The permeation is most pronounced in an extended ion-exchange immersion and least pronounced in a chemical spray. If the permeation is completed, i.e., the copper-containing compounds extend through the polycrystalline structure to the $SnO_x$, an internal low resistance path is created which short circuits the surrounding CdS and renders inactive at least a portion of the photovoltaic cell.

In accordance with the present invention, a layer is included within the layered photovoltaic cell structure which acts to inhibit or prevent permeation of the copper-containing compounds to the electrically conductive surface. In an early embodiment, aluminum was included in the first layer of CdS to obtain a crystal size range distinct from the crystal size range in the second layer of generally pure CdS.

Thus, the first layer crystals are less than 0.1 μm in diameter or in cross-section dimensions and generally less than or equal to 0.05 μm. Crystals having dimensions less than about 0.025 μm are difficult to resolve, but there does appear to be some crystal structure below 0.025 μm. The second layer crystals are greater than 0.1 μm, and less than 0.5 μm, in diameter and generally in the range of 0.1 to 0.3 μm.

In a preferred embodiment, this permeation resistance is provided by an amorphous-like structure without discernible grain boundaries. It has been found desirable to form at least a portion of the amorphous-like layer from the same semiconductor material as the overlying polycrystalline layer. The inclusion of other metal containing compounds provides enough disruption of the defined crystal lattice to result in a structure which appears amorphous even under a magnification of 100,000× by a scanning electron microscope. However, x-ray diffraction techniques indicate the presence of some crystal structure.

Where aluminum is used in the metal containing compound, it is believed that alumina ($Al_2O_3$) is formed during the chemical reaction on the sprayed surface. The exact structure of the layer containing the CdS and $Al_2O_3$ is not known, but the layer is not completely dissolved by HCl. This would suggest that the $Al_2O_3$ is not segregated in any particular segment of the layer.

While aluminum is the preferred metal because of cost and availability, zirconium has also been used to form a permeation resistant layer and may be provided in the same molar formulation as the aluminum. It is believed that zirconium could be substituted for aluminum on a mole-for-mole basis in any of the examples hereinbelow set forth.

It is believed that the permeation resistant layer is applicable to any photovoltaic cell having a polycrystalline semiconductor layer, particularly where $Cu_xS$ forms the heterjunction with a polycrystalline substance. Further, other materials which result in a suitable amorphous structure may become apparent to those skilled in the art and employed according to the present invention.

Actual formulations which have produced permeation resistant layers according to our invention are hereinafter set forth:

EXAMPLE I

In a first example of the invention, two solutions are prepared. The first solution may be in the proportion:
2 liters—Water
60 cc—$CdCl_2$ (1 Molar solution)
74 cc—Thiourea (1 Molar solution)
1.95 gm—$AlCl_3.6H_2O$ The second solution employed is in the proportion:
5 liters—Water
150 cc—Thiourea (1 Molar solution)
150 cc—$CdCl_2$ (1 Molar solution)
2.5 cc—HCl (CONC. 12 N)

While thiourea is specified as a component, its function is to produce sulfur. Other compounds which are soluble in water, and which give up sulfur, can be substituted. Specifically, N, N-Dimethyl thiourea has been employed, but thiourea is the least expensive compound which has been found satisfactory. The specific quantity of $AlCl_3.6H_2O$ in the spray solution, and of Al in the resulting film is usually greater than 10 molar percent and may be increased over a wide range. In some instances it has also been found that an excess of sulfur is desirable and the quantity of available sulfur may be increased as the aluminum content is increased.

Molar percentages of aluminum even higher than 50 molar percent may be utilized but higher percentages have not been found to produce superior performance.

The CdS film having an Al compound therein with an Al content of from 10 to 50 molar percent (2.5 to 20 weight percent) of the total metal ion content of the film is found to have properties quite different from CdS films containing no aluminum or relatively small amounts of aluminum. The layer is extremely hard, impervious to $Cu_xS$ or Cu, and is highly adherent to the $SnO_x$.

The second solution forms a layer containing only CdS, generally in crystalline form as present in a conventional photovoltaic cell. It is possible to include small quantities of impurity metals, such as zinc, to dope the CdS and alter the semiconductor properties in ways well known in the art. Inclusion of HCl is optional, and for reasons unknown increases slightly the voltage output of the cell, but so far as is known does not otherwise affect the operation of the cell.

EXAMPLE II

Similar to EXAMPLE I, but with the solutions being differently comprised. The first solution may be in the proportion:
8 liters—Water
18.63 gm—$CdCl_2.2\frac{1}{2}H_2O$
8.77 gm—Thiourea
6.96 gm—$AlCl_3.6H_2O$
2 cc—Hydrochloric acid The second solution may be in the proportion:
4 liters—Water
24.70 gm—$CdCl_2.2\frac{1}{2}H_2O$
10.96 gm—Thiourea

EXAMPLE III

A solution of water, $CdCl_2$, thiourea and $AlCl_3.6H_2O$ is sprayed on glass coated with $SnO_x$, but as the spray proceeds the proportion of $AlCl_3.6H_2O$ to $CdCl_2$ is gradually decreased, for example, logarithmically. For example, as much as 50 molar percent aluminum may be present in the solution and the lowermost part of the CdS film, and zero or substantially zero molar percent aluminum in the solution forming the upper surface of the film.

EXAMPLE IV

A first solution is prepared in the proportions:
8 liters—Water
18.63 gm—$CdCl_2.2\frac{1}{2}H_2O$
6.718 gm—$ZrCl_4$
8.77 gm—Thiourea A second solution may be prepared according to either EXAMPLE I or II to form the layer of CdS.

EXAMPLE V

A concentrated first solution is prepared in the proportions:
800 cc—Water
13.7 gm—$CdCl_2.2\frac{1}{2}H_2O$
4.83 gm—$AlCl_3.6H_2O$
6.85 gm—Thiourea A concentrated second solution is prepared in the proportions:
800 cc—Water
13.7 gm—$CdCl_2.2\frac{1}{2}H_2O$
9.13 gm—Thiourea
7.33 cc—$HNO_3$(3 N solution)

In all cases, the preferred end result is that directly in contact with the $SnO_x$ is a layer of CdS containing a metallic compound, which may be a compound of aluminum or zirconium and at the upper surface of the layer of CdS, which is to be converted to $Cu_xS$ to form a heterojunction, there is none, or very little, of the metallic compound. Two distinct layers may be employed, or a single layer may be formed having a decreasing percentage of the metallic compound in proceeding from bottom to top of the layer.

The solutions in all examples are sprayed on the glass intermittently and slowly in successive passes over a considerable period of time, of the order of 100 minutes each for the first and second coatings from EXAMPLES I, II, or IV and in the order of 180 minutes in the case of the graduated layer of EXAMPLE IV. The concentrated solutions of EXAMPLE V may be sprayed for only 30–40 minutes. In each case, the solution is sprayed intermittently and over only a small portion of the glass at any one instant so that the glass sheet remains at about the same average temperature during the spraying, despite the heat removed from the glass in the spraying process. The total thickness of each layer formed in this way is between about 1 to 4 microns, or less, with a total thickness of about 2–6 microns. The coated plate is, after spraying is completed, heated to a temperature of about 400° C. to 550° C. for 5–60 minutes to promote crystal growth.

A preferred spray solution is illustrated in Example V where the first layer forms the more amorphous layer, hereinabove described, having little discernible crystal structure and highly resistant to permeation by copper-containing materials. However, Examples I–IV produce a permeation resistance structure where the first layer crystal diameters are less than 0.1 $\mu m$ and generally range from 0.05 $\mu m$ to below 0.025 $\mu m$.

The solutions illustrated in Examples I–IV have been sprayed onto substrates heated to temperatures within the above mentioned range of 230° C. to 600° C. with the first layer being formed at a higher temperature than the second layer, generally about 20° C. higher. However, with aluminum included in the sprayed composition, the temperature differential does not appear to affect the crystal sizes as much as the aluminum and the spray concentration. Thus, it is preferred to form both layers at the same temperature.

The second layer formed from the solution of Examples I–IV has crystal diameter sizes greater than 0.1 $\mu m$ and less than 0.5 $\mu m$, generally in the range of 0.1 $\mu m$ to 0.3 $\mu m$. The larger crystal sizes produce an increased photovoltaic effect when the $Cu_xS$ barrier layer is formed on the second layer.

After the CdS layer has been formed, the substrate is slowly cooled, and the coated product is ready for the $Cu_xS$ layer. To complete a photovoltaic cell, the exposed surface of the CdS layer is converted to $Cu_xS$ by dipping the previously cooled cell into an appropriate solution at room temperature, by electroplating, by a combination of dipping and electroplating, or by spraying thereon a suitable copper-containing solution.

After the $Cu_xS$ layer has been formed, the completed photovoltaic panel may be formed into a series interconnected array of photovoltaic cells according to our patent application Ser. No. 831,544 filed Sept. 8, 1977, now abandoned, which disclosure is incorporated by reference. Electrodes are attached in a preselected configuration and the photovoltaic panel is completed by a final oven heat treatment of 400° F. to 500° F. (205° C.–260° C.).

The present method can be employed with Nesa glass as the starting material, obviating the need for coating with $SnO_x$, but Nesa glass has a sheet resistivity per square of about 50-75 ohms per square. The use of low resistivity coatings of SnOx increases the efficiency of the cell by decreasing the amount of electrical energy which is lost in the $SnO_x$.

It also appears to be advantageous if the spraying occurs by depositing droplets which are as uniform as possible. If the spray consists of many small and many large droplets, the very small droplets are evaporated by the intense heat, approximate to the exposed surface of the substrate, and only the larger droplets reach the substrate. This causes some wastage of CdS and it implies that the rate at which the spray is applied should take into account the non-uniformity of the droplets.

In accordance with the method of our parent applications, supra, the glass substrate will be moving longitudinally through a plurality of heated zones, and the spray will occur by transverse passes across the substrate as the glass moves, so that the total quantity of spray reaching any given small area of the substrate will be uniform. The method allows for the fact that spray out of an air gun or out of an electrostatic spray gun does not have a uniform pattern.

The present cell is to be exposed to solar radiation via its glass substrate. The presence of the metallic compound in the CdS does not materially affect transparency of the CdS-Al layer, so that the heterojunction may be exposed via the latter.

It should be understood that various changes, modifications, and variations in the structure and function of the present invention may be effected without departing from the spirit and scope of the present invention as defined in the appended claims.

What is claimed is:

1. An improved cadmium sulfide photovoltaic cell comprising a cadmium sulfide bilayer, the bilayer comprising an initial layer of cadmium sulfide microcrystals having an average crystal diameter of from about 0.02 microns to about 0.1 microns and a second cadmium sulfide layer comprising cadmium sulfide crystals having an average crystal diameter of from about 0.1 microns to about 0.5 microns, wherein said cadmium sulfide bilayer comprises a dopant and said second cadmium sulfide layer being in interfacial contact with a barrier layer.

2. An improved cadmium sulfide photovoltaic cell comprising a cadmium sulfide bilayer, the bilayer comprising an initial layer of cadmium sulfide microcrystals having an average crystal diameter of less than about 0.1 mircons and a second cadmium sulfide layer comprising cadmium sulfide crystals having an average crystal diameter of greater than about 0.1 microns, wherein said cadmium sulfide bilayer comprises a dopant and said second cadmium sulfide layer being in interfacial contact with a barrier layer.

3. A cell according to claim 1 or claim 2 wherein the initial cadmium sulfide layer comprises from about 1 to about 50 weight percent of an aluminum dopant.

4. A cell according to claim 3 wherein the initial cadmium sulfide layer comprises from about 2.5 to about 20 weight percent of an aluminum dopant.

5. An improved cadmium sulfide photovoltaic cell, comprising:
   a cadmium sulfide bilayer, the bilayer comprising
   an initial layer of cadmium sulfide microcrystals having average crystal diameters less than about 0.1 microns, and
   a second cadmium sulfide layer comprising cadmium sulfide crystals having an average crystal diameter of from about 0.1 microns to about 0.5 microns,
   wherein said cadmium sulfide bilayer comprises a dopant and said second cadmium sulfide layer being in interfacial contact with a barrier layer.

6. A cell according to claim 5 wherein the initial cadmium sulfide layer is formed from a solution containing from about 10 to about 50 weight percent of an aluminum dopant.

* * * * *